US007002831B2

(12) United States Patent
Matsuoka et al.

(10) Patent No.: US 7,002,831 B2
(45) Date of Patent: Feb. 21, 2006

(54) MAGNETIC SEMICONDUCTOR MEMORY DEVICE

(75) Inventors: Hideyuki Matsuoka, Nishitokyo (JP); Kenchi Ito, Sendai (JP); Takeshi Sakata, Hino (JP); Kiyoo Itoh, Higashikurume (JP)

(73) Assignee: Renesas Technology Corp., Tokyo (JP)

( * ) Notice: Subject to any disclaimer, the term of this patent is extended or adjusted under 35 U.S.C. 154(b) by 68 days.

(21) Appl. No.: 10/715,448

(22) Filed: Nov. 19, 2003

(65) Prior Publication Data

US 2004/0105326 A1 Jun. 3, 2004

(30) Foreign Application Priority Data

Nov. 28, 2002 (JP) ............................ P2002-345530

(51) Int. Cl.
*G11C 17/02* (2006.01)
(52) U.S. Cl. ......................................... 365/97; 257/295
(58) Field of Classification Search ................ 257/302, 257/529, 295; 365/97, 158, 171, 200
See application file for complete search history.

(56) References Cited

U.S. PATENT DOCUMENTS 6,560,135 B1 * 5/2003 Matsuoka et al. ............. 365/97

| 6,771,535 B1 * | 8/2004 | Sakata et al. ............... 365/158 |
| 6,876,523 B1 * | 4/2005 | Takahashi et al. ..... 360/324.11 |
| 2002/0093845 A1 | 7/2002 | Matsuoka et al. ............ 365/97 |

FOREIGN PATENT DOCUMENTS

JP          2002-208682          7/2002

OTHER PUBLICATIONS

Durlam et al., "A low power 1Mbit MRAM based on 1T1MTJ bit cell integrated with Copper Interconnects," 2002 Symposium on VLSI Circuits Digest of Technical Papers, pp. 160-163.

* cited by examiner

*Primary Examiner*—David Nelms
*Assistant Examiner*—Dao H. Nguyen
(74) *Attorney, Agent, or Firm*—Miles & Stockbridge PC

(57) ABSTRACT

A memory cell in a so-called MRAM by utilizing a tunnel magnetic resistance in the prior art has raised problems that a magnetic field to be applied to a TMR element is essentially weak since a word line for write is disposed apart from the TMR element, that a large current is required at the time of a writing operation, and that electric power consumption is large. In order to solve the above-described problems experienced in the prior art, the present invention provides an MRAM memory cell structure and its fabricating method in which a word line for write is disposed near a TMR element and surrounds it in three directions.

19 Claims, 18 Drawing Sheets

PRIOR ART

$1/R \sim D1(E) \cdot D2(E)$
1: BEFORE TUNNELING
2: AFTER TUNNELING

RESISTANCE: SMALL

WHEN THE SPINS ARE PARALLEL

RESISTANCE: LARGE

WHEN THE SPINS ARE ANTI-PARALLEL (CROSS SECTION ALONG AA-DIRECTION IN FIG.10)

TMR SHAPE

MAGNETIC SEMICONDUCTOR MEMORY DEVICE

BACKGROUND OF THE INVENTION

1. Field of the Invention

The present invention relates to a semiconductor memory device. In particular, the present invention relates to a fast non-volatile random access memory (RAM) by utilizing a magneto resistance effect.

2. Description of the Related Art

Expectations have been raised on an MRAM (a magnetic random access memory) as a next generation fast non-volatile memory provided with merits of both of a DRAM and a FLASH, which are typical semiconductor memories for the present.

The MRAM is a fast non-volatile memory by utilizing a tunnel magneto resistance (TMR) of a ferromagnetic spin tunnel junction (MTJ). Since IBM has announced that a memory of 256 M bit will be produced in 2004 in cooperation with Infineon, such a memory has become a focus of attention. On the academic level, Motorola tried to fabricate an array of 1 MB and reported the confirmation of memory operation in 2002 Symposium on VLSI Circuits Digest of Technical Papers, pp. 160–163.

The operating principle of the MRAM will be simply described below. First, a description will be given of both of the MTJ and the TMR as the bases of a memory function. In the MTJ, a thin tunnel insulator film 2 is held between two ferromagnetic layers 1 and 3, as illustrated in, for example, FIG. 2. The tunnel conductance of this structure is proportional to the product of the density of states on a Fermi level of two ferromagnetic materials. FIGS. 3A and 3B illustrate the density of states when the spins of the two ferromagnetic materials are parallel (FIG. 3A) and anti-parallel (FIG. 3B) in comparison with each other. Since the spin direction is held before and after tunneling, a tunnel resistance is small when the spins are parallel; in contrast, it is great when the spins are anti-parallel, as is clear from FIGS. 3A and 3B. As a result, one of the spin directions of ferromagnetic spin tunnel junctions is fixed while the other spin direction is varied by an outer magnetic field, so that hysteresis characteristics illustrated in FIG. 4 are exhibited, thereby providing a memory. A spin flip rate is represented in the order of nsec. Even if no magnetic field is applied, the spin direction is fixed, and therefore, the operation of the fast non-volatile memory can be expected.

FIGS. 5 and 6 illustrate an equivalent circuit of the MRAM which has been commercially available so far, and its cross-sectional structure. Next, explanation will be made on writing and reading operations in the MRAM illustrated in FIGS. 5 and 6. At the time of a writing operation, a current is allowed to flow in a bit line 6 and a word line 7 for write, and then, the spin direction is written at a selected cell by a generated combined magnetic field. At a non-selected cell, since an applied magnetic field is small, the spin direction cannot be varied. At the time of a reading operation, a word line 8 for read is turned on, and then, '0' and '1' are determined based on a current flowing between a common ground line 13 and the bit line 6.

As described above, in the MRAM, the current is allowed to flow in the word line for write and the bit line, and data is written by using the generated combined magnetic field. At this time, since the word line 7 for write is separated from a TMR element in view of a distance, it is, in principle, necessary to allow a large current to flow when the data is written. Consequently, there has arisen a problem that power consumption is large. Moreover, it has been necessary to reduce a write current from the viewpoint of the secureness of migration reliability of a wiring.

SUMMARY OF THE INVENTION

In view of the above-described problems observed in the prior art, an object of the present invention is to provide a semiconductor memory device in which power consumption required for writing can be reduced in an MRAM, and simultaneously, and the reliability of a wiring can be enhanced.

In order to achieve the above-described object and solve the above-described problems, a semiconductor memory device according to the present invention comprises: first and second word lines arranged in parallel to each other; a data line crossing the first and second word lines via an insulator layer; and a memory array including numerous memory cells arranged at crossing points between the first and second word lines and the data line; wherein each of the numerous memory cells includes a magnetic resistance element and a transistor, and the second word line surrounds around the magnetic resistance element in at least three directions via the insulator layer.

DETAILED DESCRIPTION OF THE PREFERRED EMBODIMENTS

Figure 1:
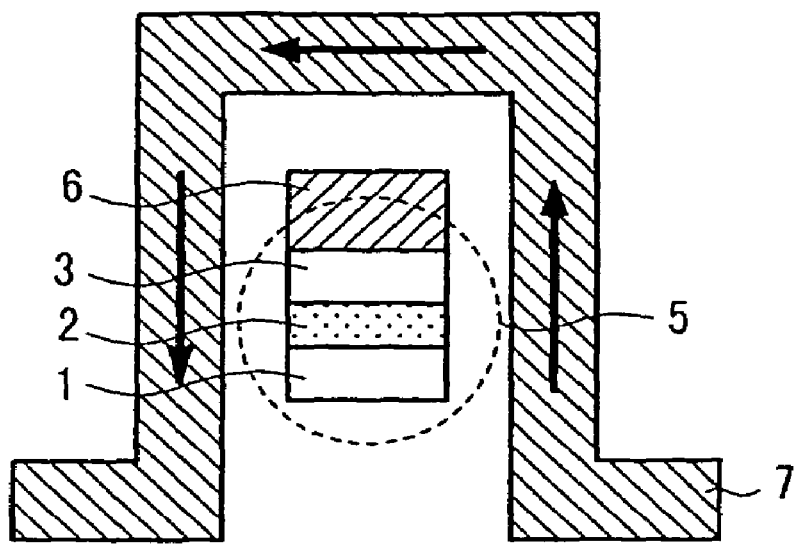
FIG. 1 is a diagram illustrating the arrangement of a TMR element and a word line for write in an MRAM according to the present invention.
Figure 2:
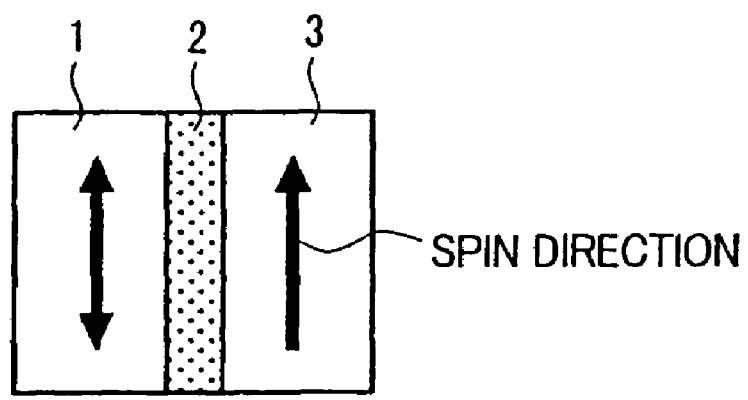
FIG. 2 is a diagram illustrating the structure of a ferromagnetic spin tunnel junction (the TMR element)
Figure 3A:
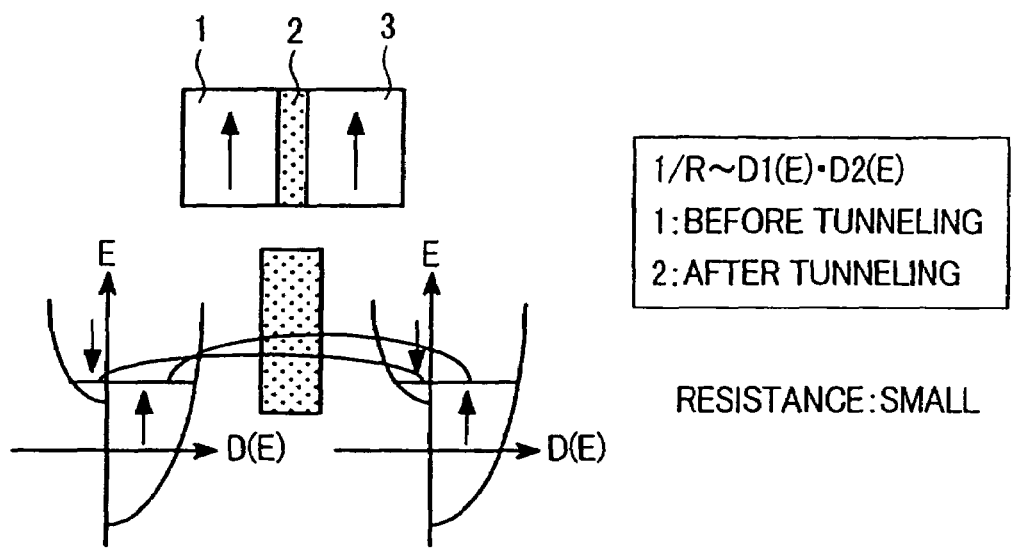
FIG. 3A is a diagram illustrating the density of states when spins are parallel in an MTJ.
Figure 3B:
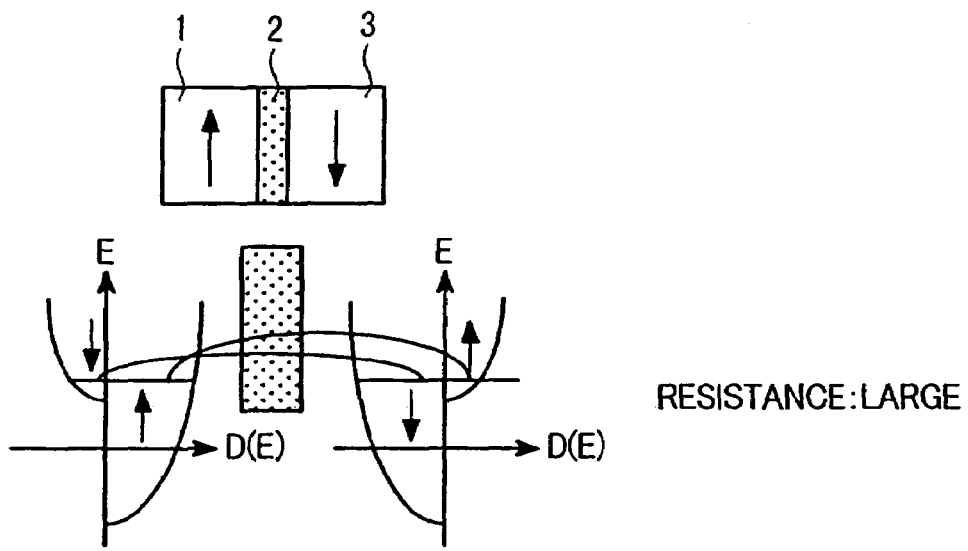
FIG. 3B is a diagram illustrating the density of states when the spins are anti-parallel in the MTJ.
Figure 4:
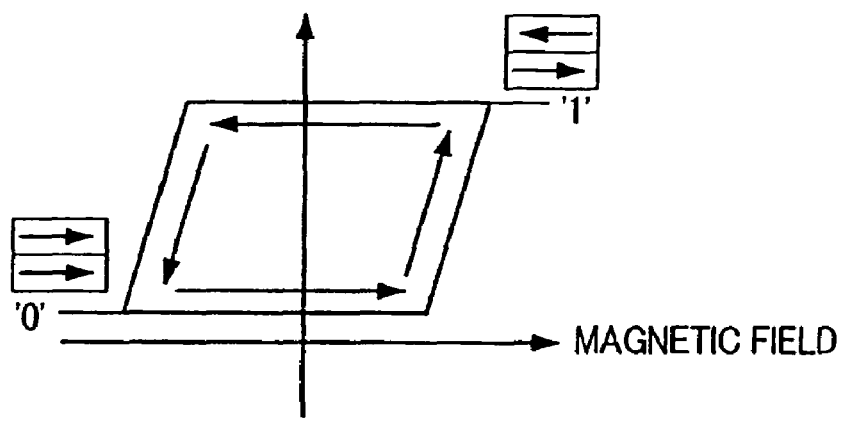
FIG. 4 is a diagram illustrating the dependency of a tunnel resistance on a magnetic field.
Figure 5:
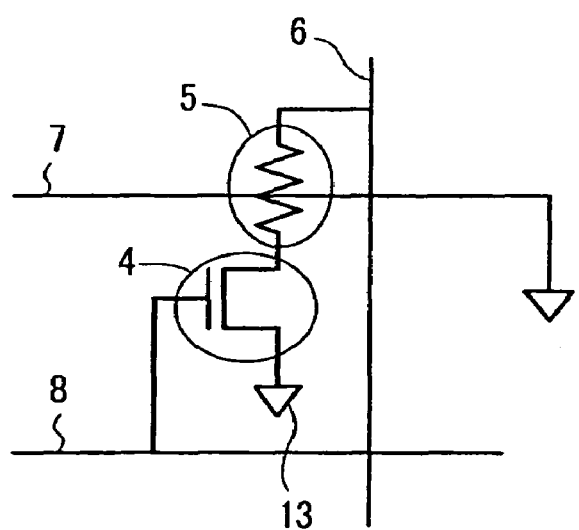
FIG. 5 is a diagram illustrating an equivalent circuit of an MRAM memory cell.
Figure 6:
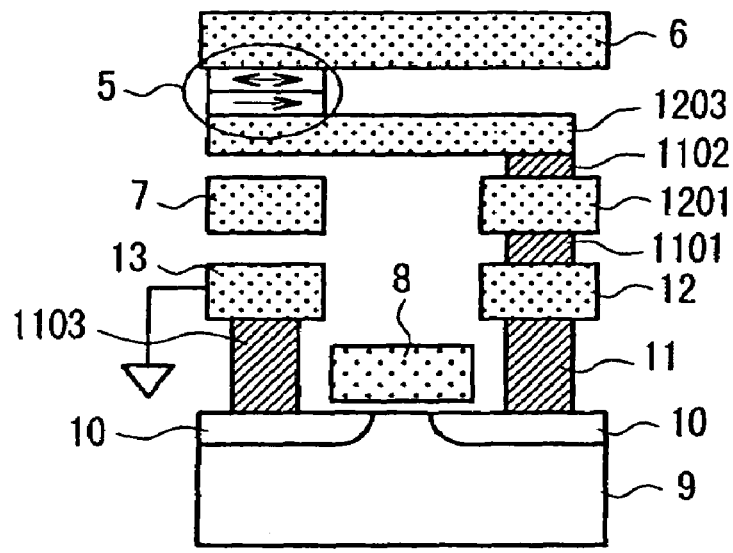
FIG. 6 is a diagram illustrating the structure of a conventional MRAM memory cell.
Figure 7:
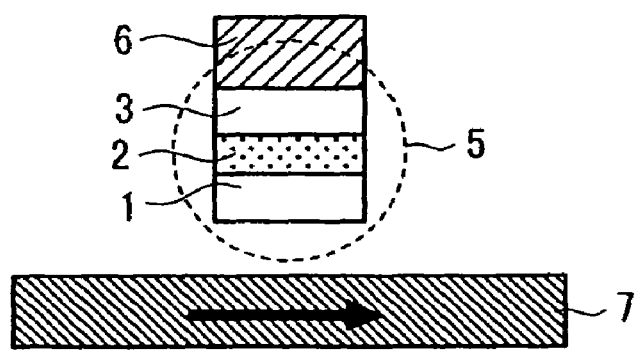
FIG. 7 is a diagram illustrating the arrangement of a TMR element and a word line for write in a conventional MRAM.

The present invention is configured such that a word line 7 for write surrounds a TMR element 5, as illustrated in FIG. 1. Hereinafter, explanation will be made on the effect of this structure. A current is allowed to flow in a direction indicated by arrows by applying a difference in potential at both ends of the word line 7 for write. All of magnetic fields generated with respect to the TMR at three portions indicated by the arrows are directed frontward from the back in the drawing sheet. Consequently, the magnetic fields from the three portions are applied to the TMR element, and therefore, the magnetic fields can be effectively increased in comparison with the prior art illustrated in FIG. 7.

Figure 8:
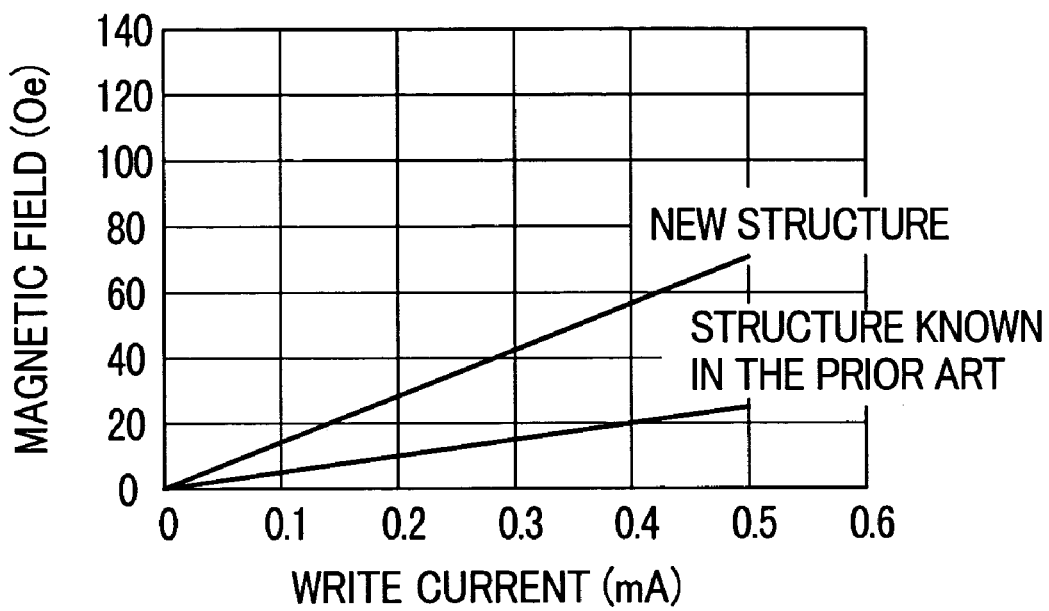
FIG. 8 is a graph illustrating the effect of an increase in generated magnetic field according to the present invention.

FIG. 8 is a graph illustrating the effect according to the present invention, which has been studied by simulation. It is found that the magnetic field about triple as great as that in a conventional wiring structure can be generated. This shows that a current required for writing data can be reduced down to about ⅓ from the viewpoint of power reduction.

A description will be given below of embodiments according to the present invention.

<First Embodiment>

The present embodiment is directed to a method for fabricating a semiconductor memory device, in which power reduction can be achieved in an MRAM comprising a select transistor and a TMR element. A normal transistor to be formed on a Si substrate is used as the select transistor. Explanation will be made below in accordance with fabricating processes.

Figure 9:
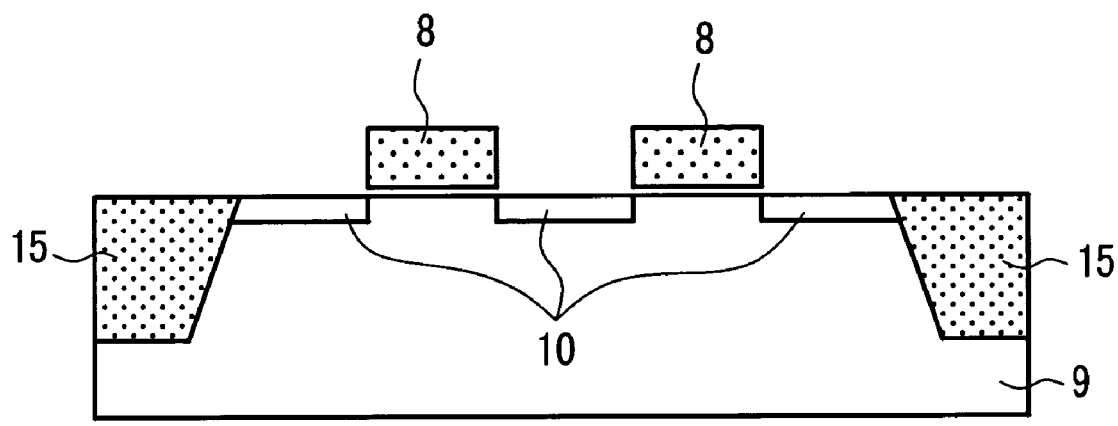
FIG. 9 is a cross-sectional view showing a fabricating process of a semiconductor memory device according to the present invention.
Figure 10:
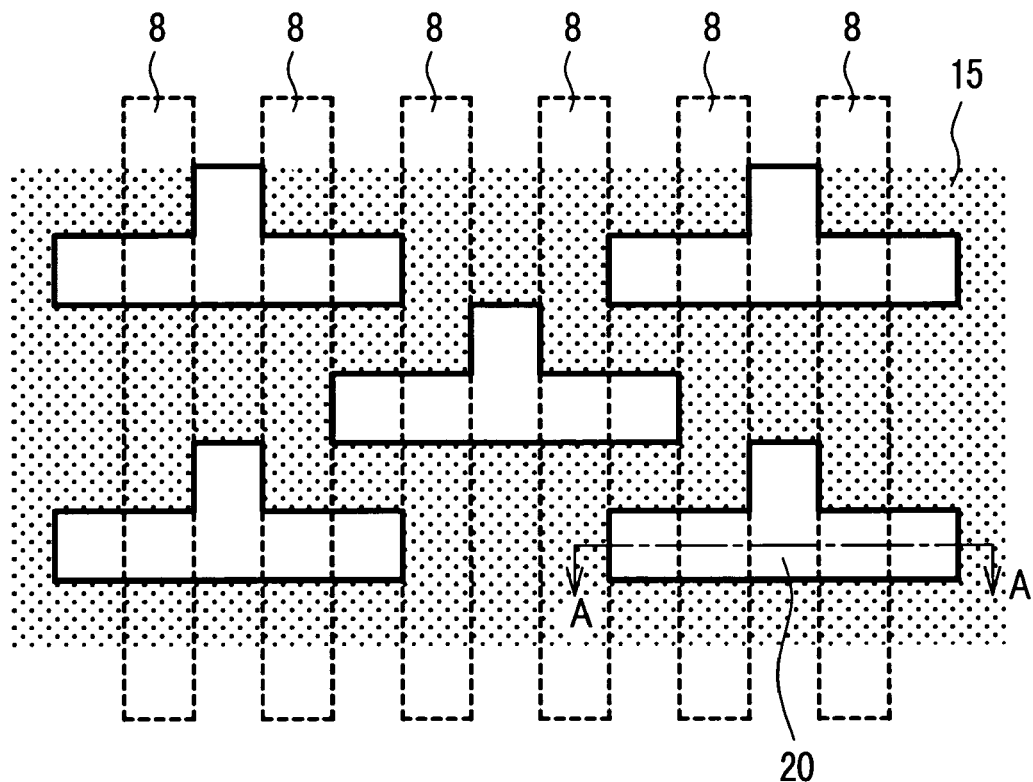
FIG. 10 is top view showing the fabricating process of the semiconductor memory device according to the present invention.
Figure 11:
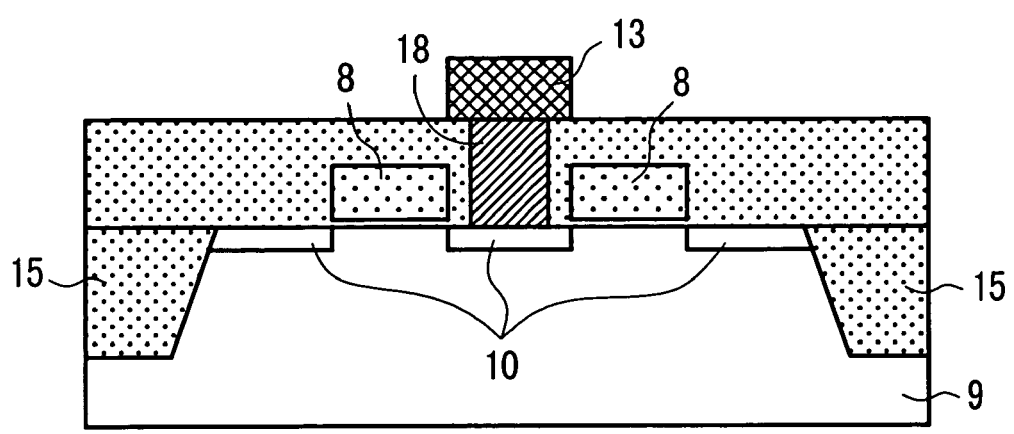
FIG. 11 is a cross-sectional view showing a fabricating process of the semiconductor memory device according to the present invention.
Figure 12:
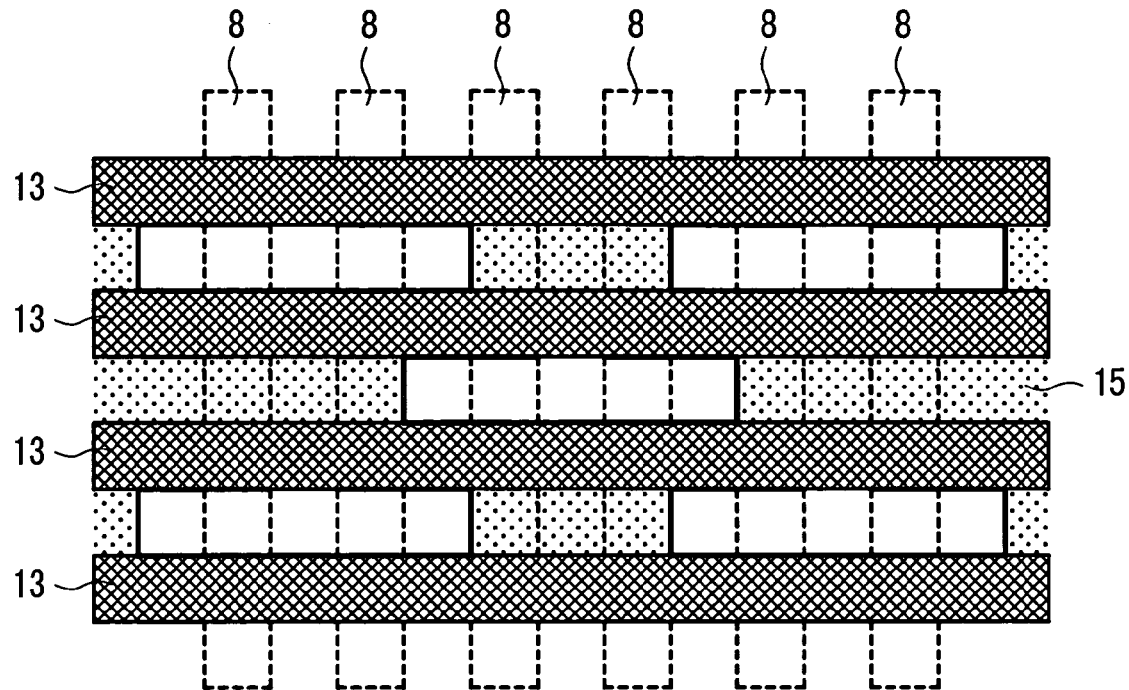
FIG. 12 is a top view showing the fabricating process of the semiconductor memory device according to the present invention.
Figure 13:
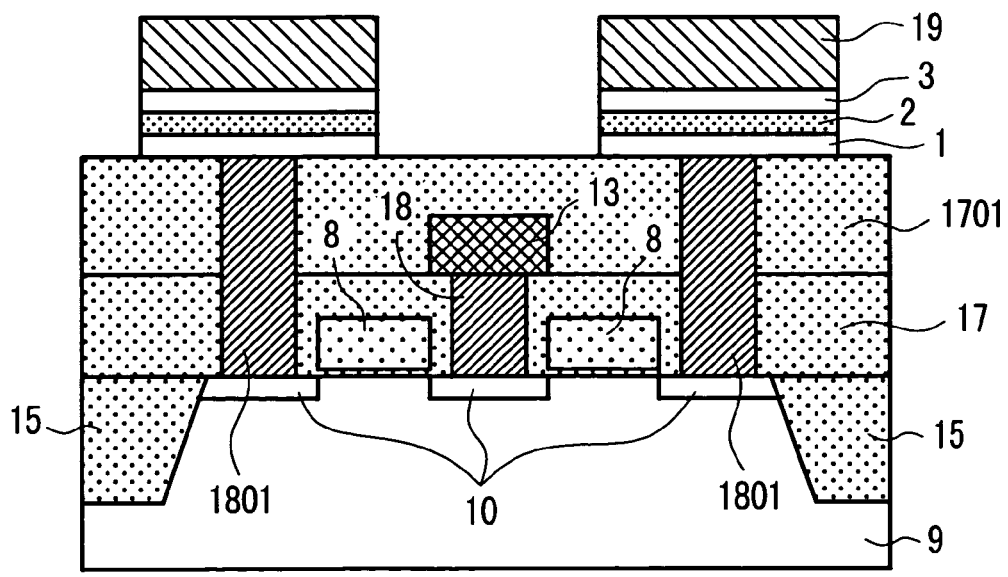
FIG. 13 is a cross-sectional view showing a fabricating process of the semiconductor memory device according to the present invention.
Figure 14:
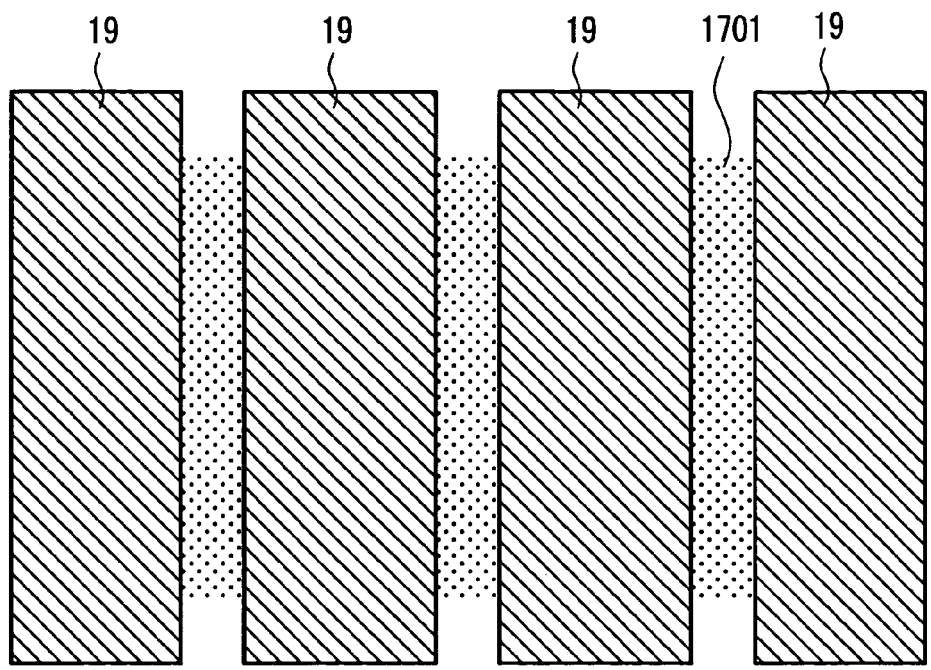
FIG. 14 is a top view showing the fabricating process of the semiconductor memory device according to the present invention.

The select transistor is formed in a p-type semiconductor substrate 9 by using normal semiconductor forming processes, as shown in FIG. 9. FIG. 10 illustrates a layout at this time. Here, FIG. 9 is a cross-sectional view taken along an arrow A—A of FIG. 10. Subsequently, an interlayer dielectric 17 is deposited and planarized, and then, a contact is opened. Thereafter, a conductive plug 18 is formed, and further, a common electrode 13 is formed, as shown in FIG. 11. The common electrode 13 serves as a first local wiring in a peripheral circuit. FIG. 12 illustrates a layout at this time. In the present embodiment, the conductive plug 18 and the common electrode 13 are made of tungsten. Subsequently, an inter layer 1701 is deposited, a conductive plug is formed, and thereafter, layered magnetic films 1, 2 and 3, which serve as TMR elements later, are deposited. Here, there is used a layered film having the structure of NiFe/CoFe/AlOx/NiFe/IrMn from above. It is understood that other materials capable of exhibiting a TMR effect may be used. Furthermore, tungsten W 19 is deposited in a thickness of 50 nm. Metal such as TiN or aluminum may be used in place of W. Next, as shown in FIG. 13, the layered structure is separated in a direction parallel to a word line 8 for read. FIG. 14 is a top view at this time. Moreover, an interlayer dielectric 1702 is deposited and planarized, so that the underlayer W 19 is exposed.

Figure 15:
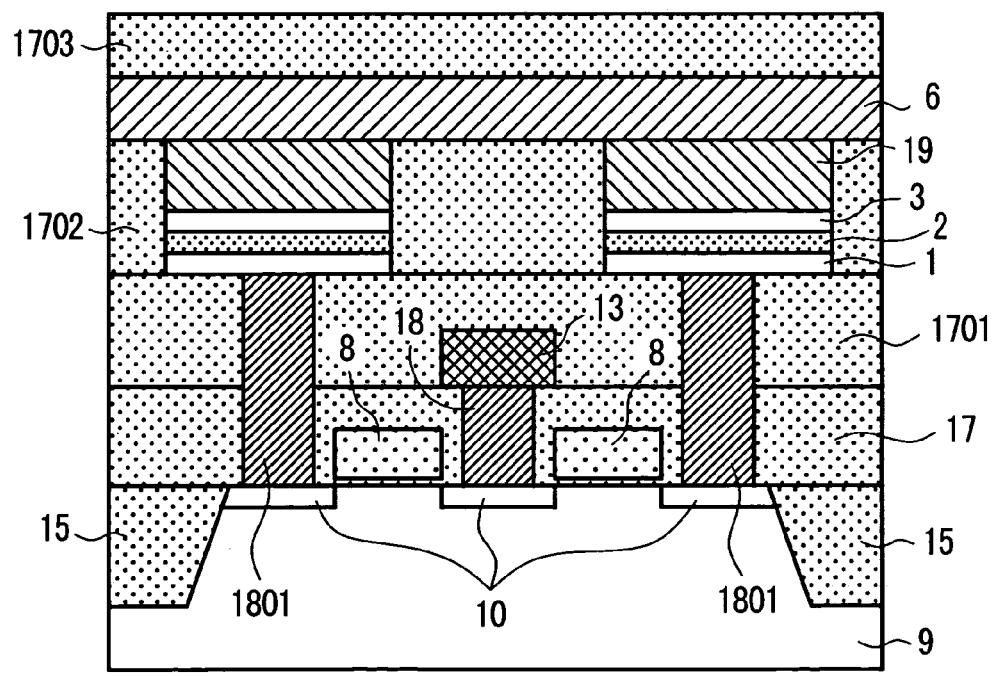
FIG. 15 is a cross-sectional view showing a fabricating process of the semiconductor memory device according to the present invention.
Figure 16:
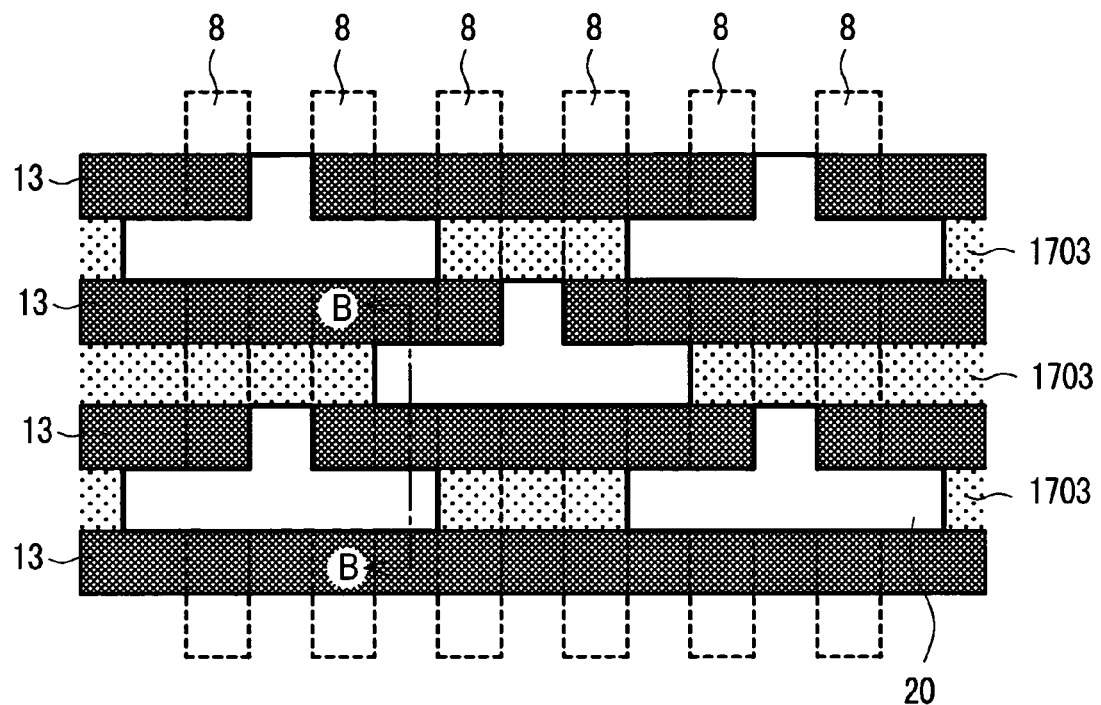
FIG. 16 is a top view showing the fabricating process of the semiconductor memory device according to the present invention.
Figure 17:
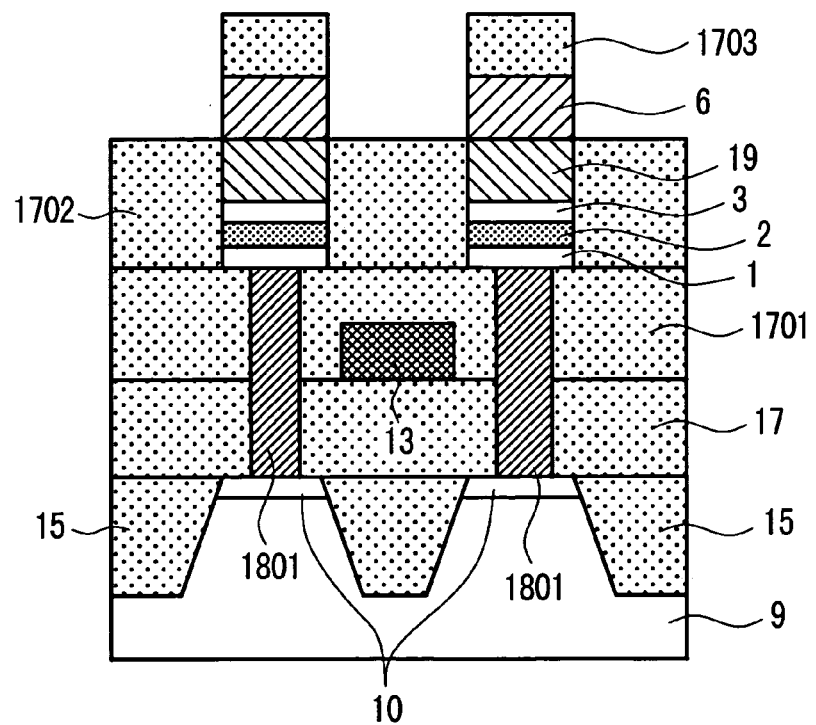
FIG. 17 is a cross-sectional view showing a fabricating process of the semiconductor memory device according to the present invention.
Figure 18:
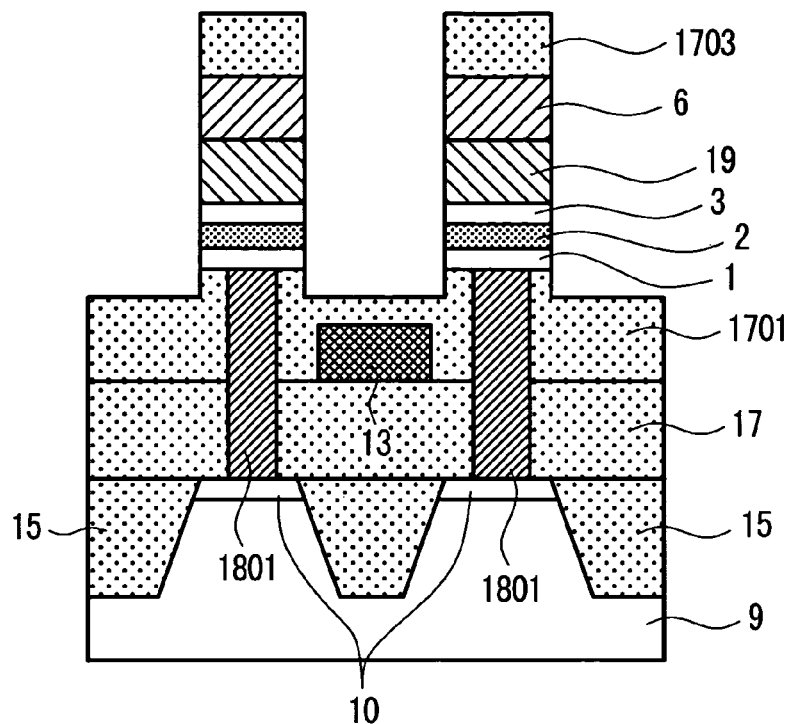
FIG. 18 is a cross-sectional view showing a fabricating process of the semiconductor memory device according to the present invention.
Figure 19:
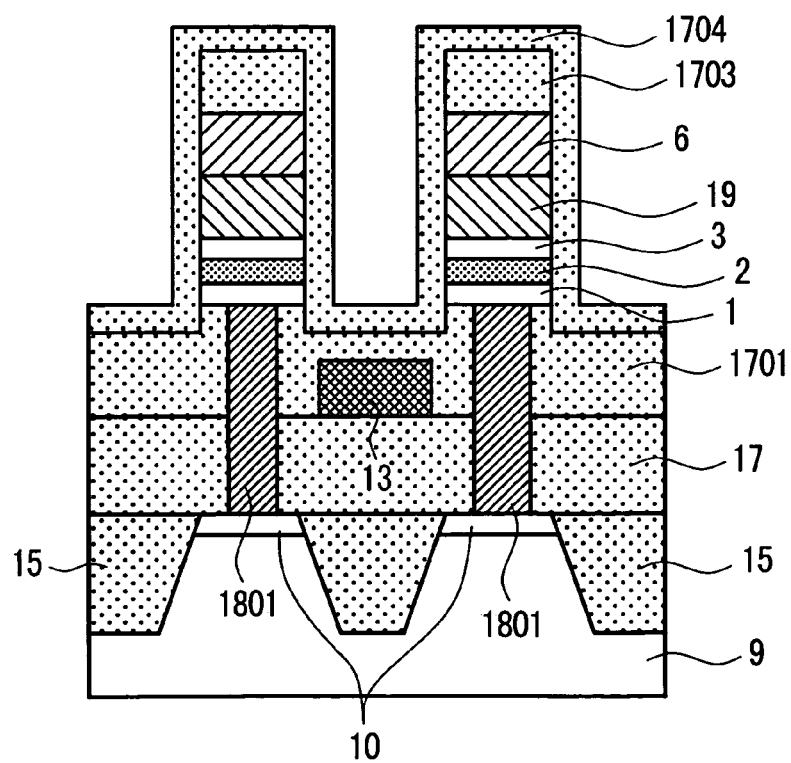
FIG. 19 is a cross-sectional view showing a fabricating process of the semiconductor memory device according to the present invention.
Figure 20:
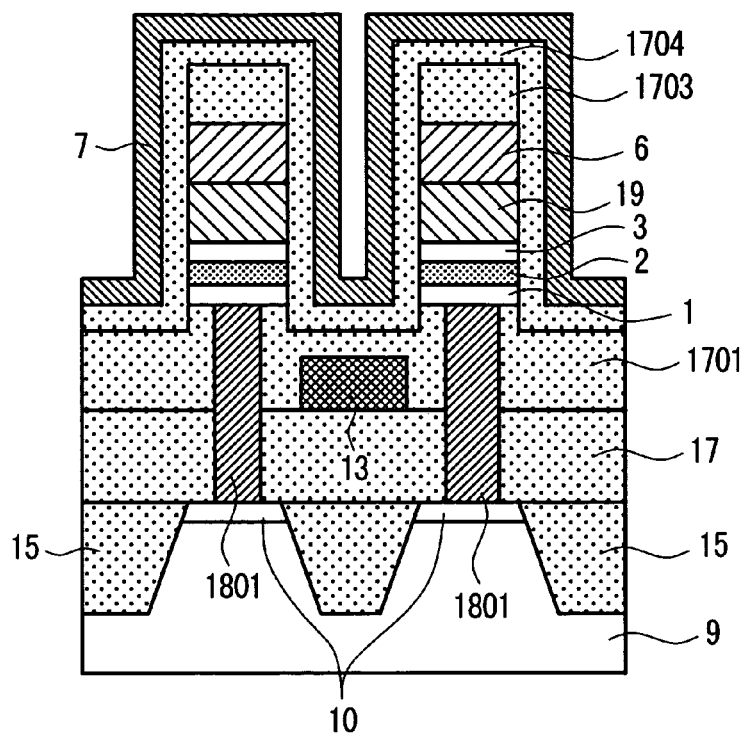
FIG. 20 is a cross-sectional view showing a fabricating process of the semiconductor memory device according to the present invention.
Figure 21:
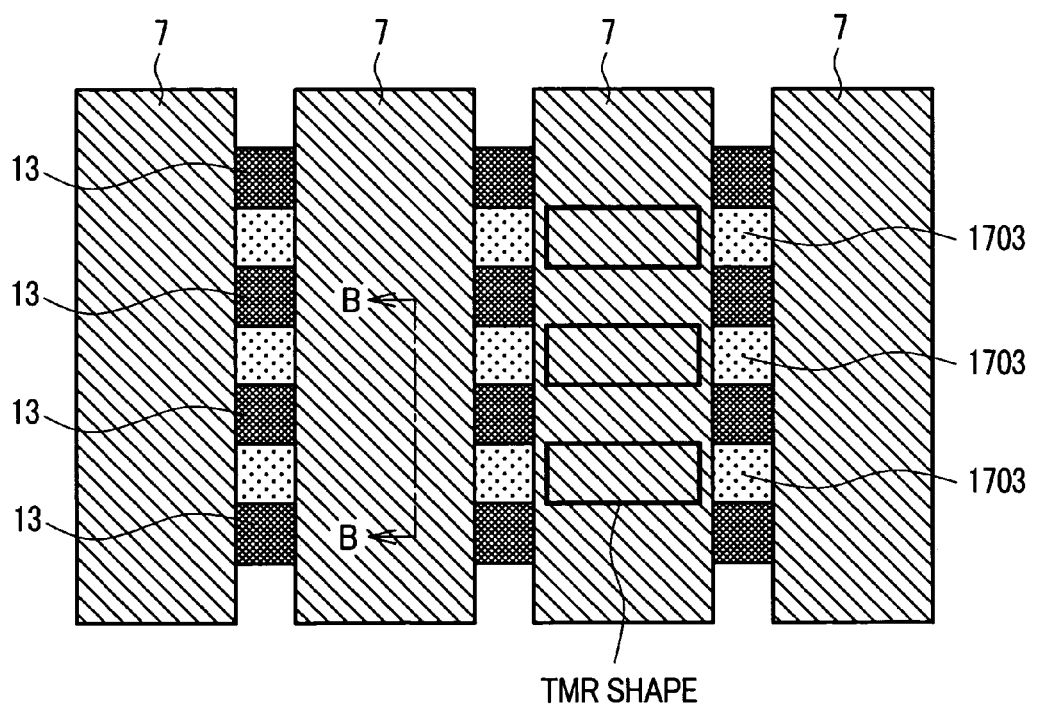
FIG. 21 is a top view showing the fabricating process of the semiconductor memory device according to the present invention.

Next, tungsten 6 serving as a bit line in a thickness of 100 nm and a silicon oxide film 1703 in a thickness of 100 nm are deposited, and then, a resist as a mask is separated in a direction perpendicular to the word line 8. Moreover, the underlayer W 19 and the layered magnetic film are processed in a self-aligned manner by using the bit line 6 as a mask, as shown in FIG. 15. The bit line 6 serves as a second local wiring in the peripheral circuit. FIG. 16 is a top view at this time. In FIG. 16, for the sake of easy understanding, an active area 20 and the word line 8 are drawn on the common electrode 13 and the silicon oxide film 1703 on the bit line 6. FIG. 17 is a cross-sectional view in a direction perpendicular to FIG. 15, taken along an arrow B—B of FIG. 16. Furthermore, the interlayer dielectric 1702 serving as the under layer is etched by using the bit line 6 as a mask, as shown in FIG. 18. Thereafter, as shown in FIG. 19, a silicon oxide film 1704 is deposited in a thickness of 50 nm by CVD. Next, tungsten serving as the word line 7 for write is deposited in a thickness of 50 nm, and is separated in a direction perpendicular to the bit line by normal photolithography and dry etching, as shown in FIG. 20. FIG. 21 is a top view at this time.

Hereinafter, a multi-layer wiring is formed by the normal wiring processes, thus providing a desired semiconductor device.

Figure 33:
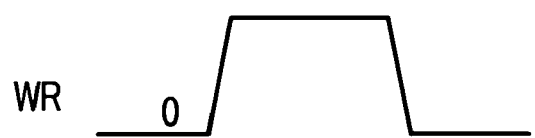
FIG. 33 is a chart illustrating a reading operation in an embodiment according to the present invention.
Figure 33:
Figure 33:
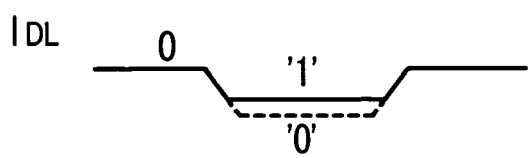
Figure 34:
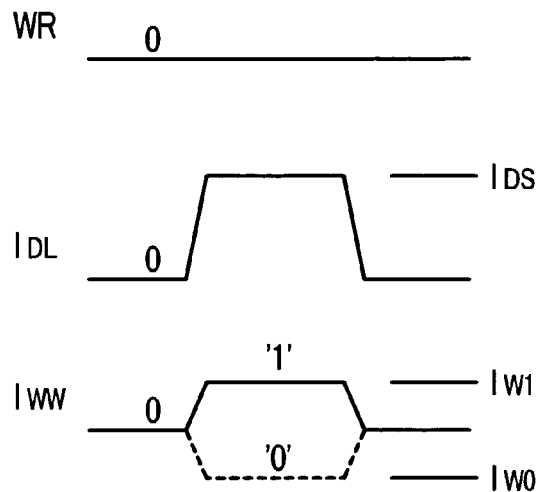
FIG. 34 is a chart illustrating a writing operation in the embodiment according to the present invention.

Finally, simple explanation will be made on a memory array operation in the present embodiment. As illustrated in FIG. 33, the level of a word line WR for read selected in a memory array is made high, so that a reading operation is performed by detecting a current IDL flowing via a desired data line according to a TMR element resistance. At this time, no current flows in a word line WW for write. In the meantime, a writing operation is as follows. As illustrated in FIG. 21, the TMR has shape anisotropy, in which the longitudinal direction is parallel to the direction of the bit line (traveling in the direction 1703). As a result, the spin direction is defined by the direction of the current flowing in the word line 7 for write. Consequently, the current IDL of the selected data line is used as the write bit line current IDS, and further, the write current IW1 or IW0 according to the write data is allowed to flow in the selected word line for write, thereby generating a magnetic field, so that the writing operation is performed, as illustrated in FIG. 34.

In the present embodiment, since the word line WR for write is configured to surround the TMR at the three surfaces, the magnetic field can be effectively applied in comparison with the prior art. Thus, the operation can be achieved with power reduction.

<Second Embodiment>

The present embodiment is directed to a method for achieving power reduction more than in the first embodiment. In order to accomplish the object, a bit line is covered with a soft magnetic material such as NiFe. As a result, it is possible to prevent any leakage of a magnetic field from a portion covered with the magnetic material, so as to generate a stronger magnetic field, thereby achieving power reduction. A fabricating method will be described below in reference to the attached drawings.

Figure 22:
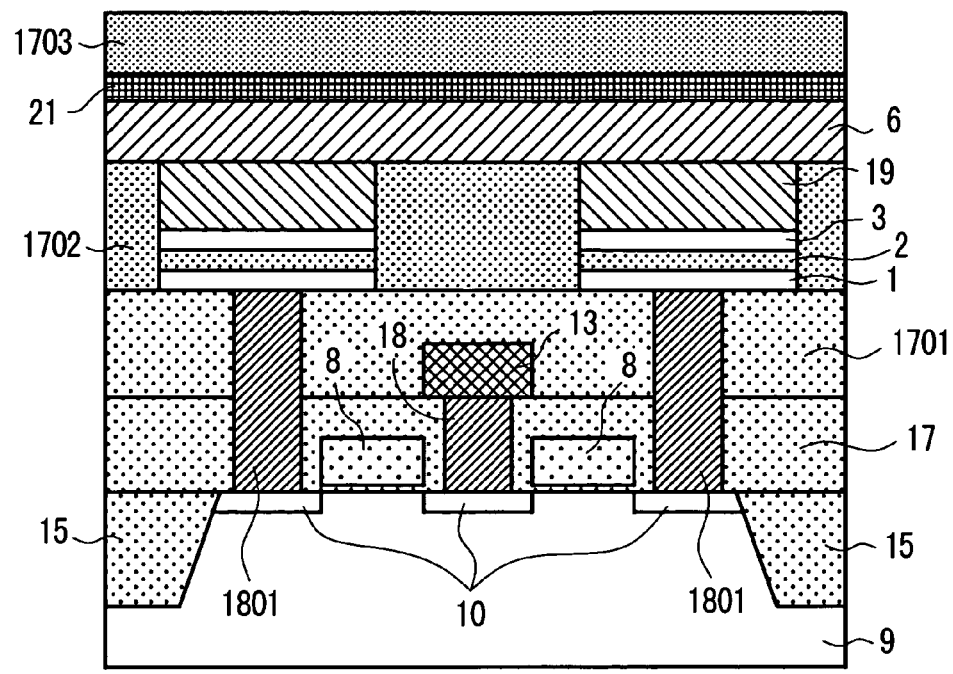
FIG. 22 is a cross-sectional view showing a fabricating process of the semiconductor memory device according to the present invention.

The fore half of the fabricating processes are the same as those in the first embodiment. Specifically, the processes illustrated in FIGS. 9 to 14 are the same as those in the first embodiment. Subsequently, tungsten serving as a bit line is deposited in a thickness of 100 nm. Next, for the purpose of magnetic shield, a soft magnetic material 21 such as NiFe is deposited in a thickness of 10 nm. Furthermore, a silicon oxide film is deposited in a thickness of 100 nm. The resultant layered structure is separated in a direction perpendicular to a word line for read by normal lithography and dry etching, as shown in FIG. 22. The layout at this time is the same as that shown in FIG. 16.

Figure 23:
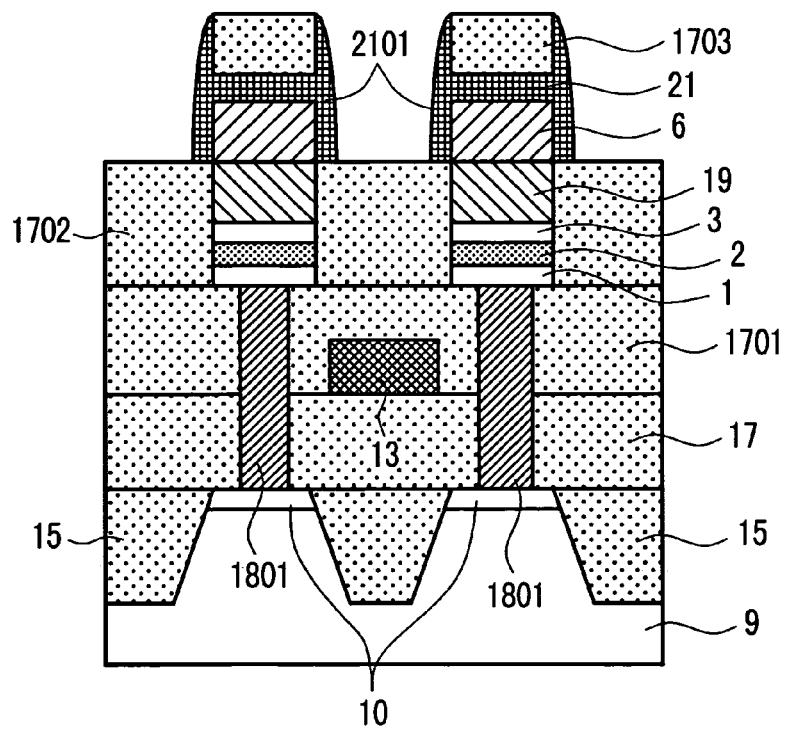
FIG. 23 is a cross-sectional view showing a fabricating process of the semiconductor memory device according to the present invention.
Figure 24:
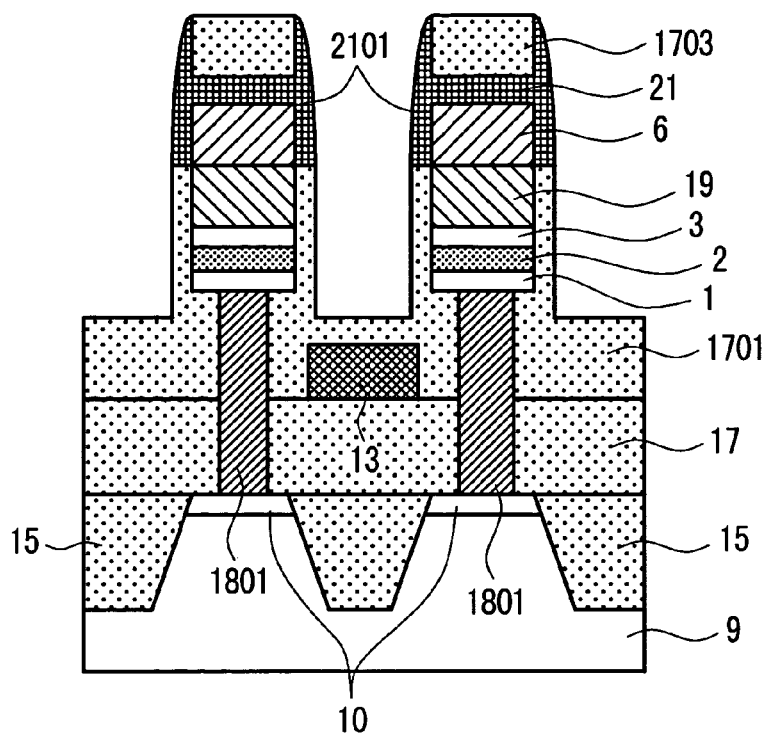
FIG. 24 is a cross-sectional view showing a fabricating process of the semiconductor memory device according to the present invention.

Moreover, for the purpose of magnetic shield at the side of a bit line 6, a soft magnetic material 2101 such as NiFe is deposited, followed by spacer formation by normal anisotropic dry etching, as shown in FIG. 23. Here, FIG. 23 is a view in a direction perpendicular to FIG. 22, that is, a cross-sectional view taken along the arrow B—B of FIG. 16. Subsequently, an underlayer oxide film is etched in a self-aligned manner by using the bit line covered with the soft magnetic material 2101 as a mask, as shown in FIG. 24.

Figure 25:
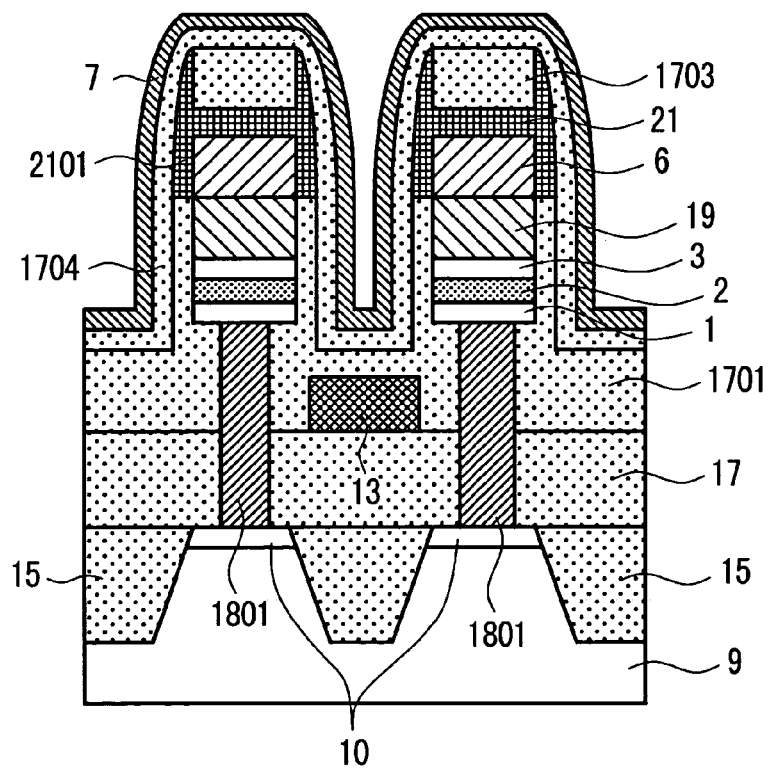
FIG. 25 is a cross-sectional view showing a fabricating process of the semiconductor memory device according to the present invention.

Thereafter, for the purpose of electric insulation between the word line for write and the bit line, a silicon oxide film 1704 is deposited in a thickness of 50 nm, and then, tungsten serving as a word line 7 for write is deposited in a thickness of 50 nm, as shown in FIG. 25. Subsequently, the word line for write is separated in a direction perpendicular to the bit line by normal photo and dry etching, as shown in FIG. 21. Hereinafter, a multi-layer wiring is formed by the normal wiring processes, thus providing a desired semiconductor device.

In the present embodiment, the bit line is covered with the soft magnetic material, followed by the magnetic shield, so that the magnetic field from the bit line can be more effectively applied to the TMR element. Consequently, a write current can be reduced, thereby achieving power reduction. In the present embodiment, it is to be understood that the word line for write should be configured to have the magnetic shield in the same processes as those for the bit line.

In this case, the power reduction can be further achieved.

<Third Embodiment>

In the first and second embodiments, the normal planar transistor is used as the select transistor in the MRAM. In the present embodiment, a vertical transistor is used as the select transistor, thereby reducing a cell area. Unlike the DRAM, a leak current in a cell transistor cannot critically influence on a memory function in the MRAM. This is because information is held in the spin direction. Thus, in the present embodiment, processes are simplified by forming the vertical transistor with polycrystalline silicon. Hereinafter, explanation will be made in reference to the attached drawings.

Figure 26:
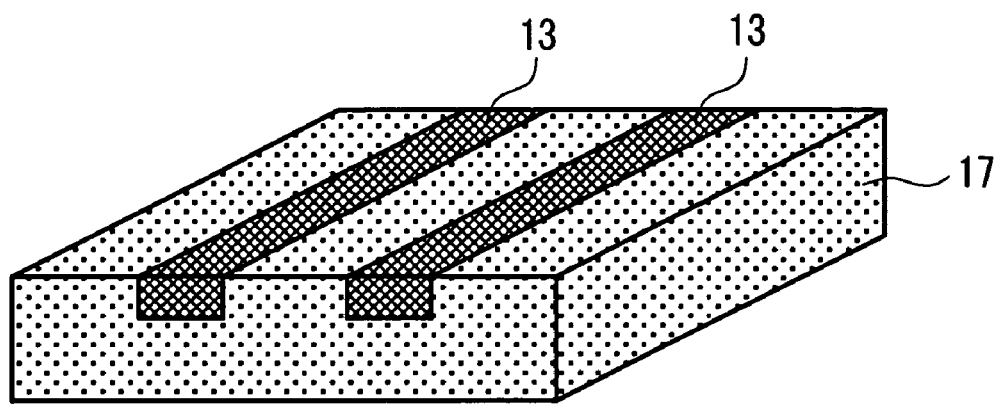
FIG. 26 is a perspective view showing a fabricating process of the semiconductor memory device according to the present invention.
Figure 27:
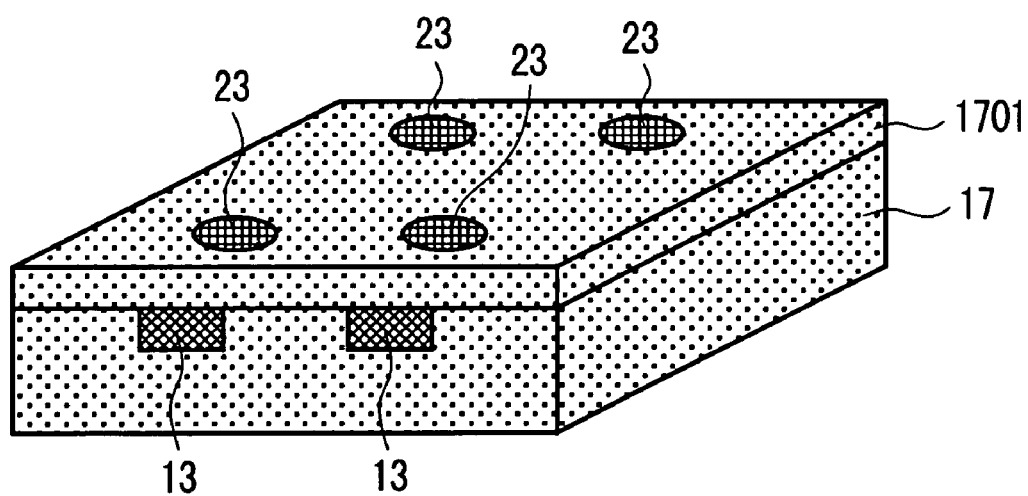
FIG. 27 is a perspective view showing a fabricating process of the semiconductor memory device according to the present invention.

A transistor in a peripheral circuit is formed in normal fabricating processes. After the deposition of an interlayer dielectric 17, a contact plug is fabricated, and further, a first local wiring made of tungsten is formed. In a memory array, the resultant wiring layer is used as a common ground line 13. The state at this time is shown in FIG. 26. Subsequently, an interlayer dielectric 1701 is deposited, a polysilicon plug 23 containing impurities in a high density is formed, and then, is separated per memory cell, as shown in FIG. 27. Thereafter, a vertical transistor and a TMR unit are formed. Here, layers are laminated in the following order. First, an N+ layer 10, which is doped with impurities in a high density and serves as a diffusion layer for the vertical transistor, a diffusion layer 22 with low-impurity concentration serving as a channel and an N+ layer 1001 serving as a diffusion layer are laminated in this order. These layers constitute a transistor. At this time, the above-described polycrystalline silicon may be made to be single crystals by laser annealing or the like. In this case, it is to be understood that the performance of the transistor should be enhanced.

Figure 28:
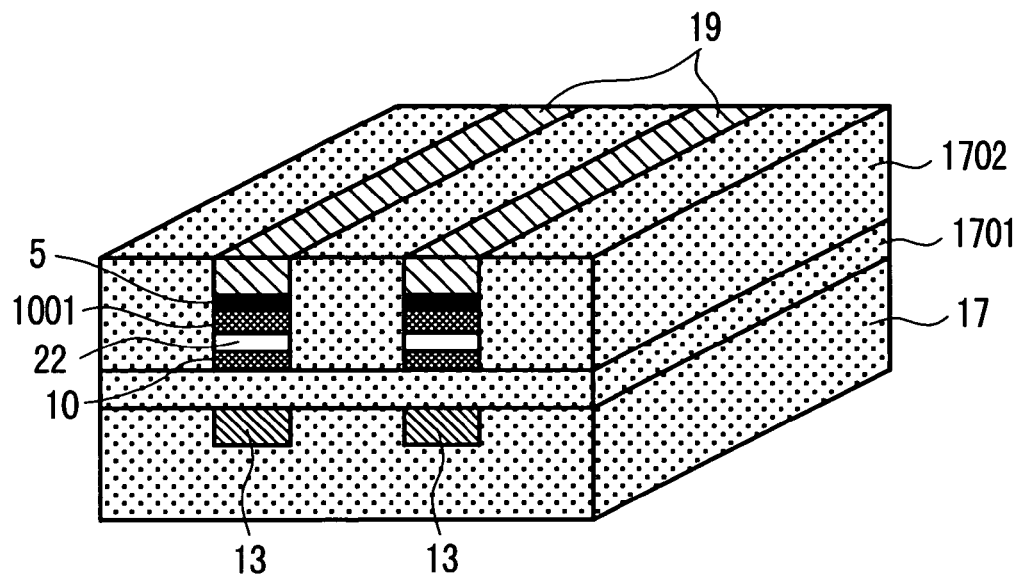
FIG. 28 is a perspective view showing a fabricating process of the semiconductor memory device according to the present invention.

Next, NiFe, $Al_2O_3$ and CoFe are deposited in order as a layer constituting a TMR element 5. Furthermore, in order to secure a machining margin, tungsten W 19 is deposited in a thickness of 50 nm. The resultant layered structure is processed in a line-and-space manner by normal photolithography and dry etching. Subsequently, an interlayer dielectric 1702 is deposited, followed by planarization by CMP, and further, the underlayer tungsten W 19 is exposed, as shown in FIG. 28.

Figure 29:
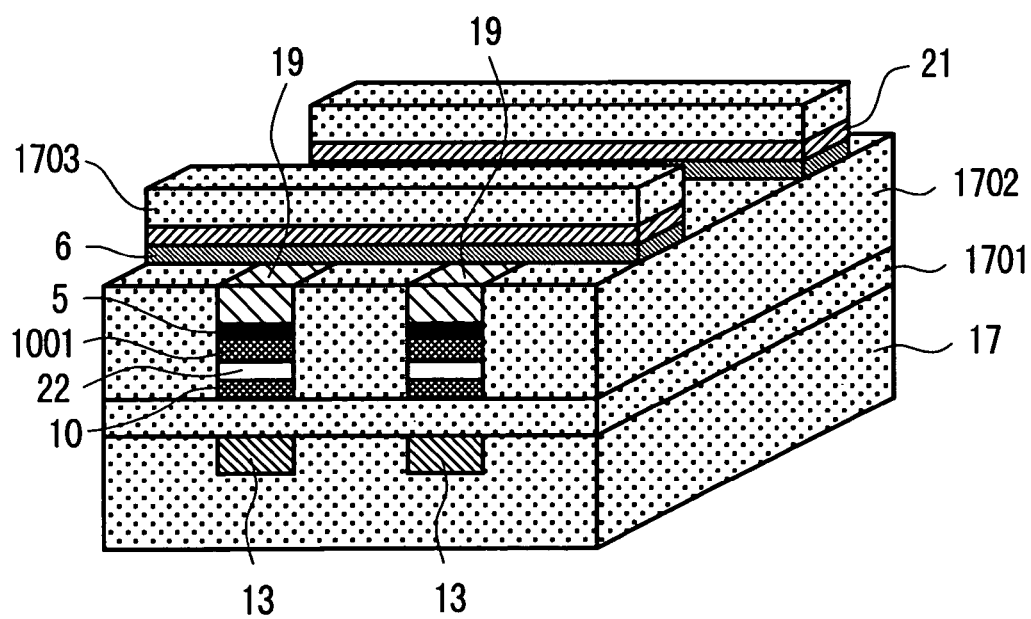
FIG. 29 is a perspective view showing a fabricating process of the semiconductor memory device according to the present invention.

Thereafter, tungsten serving as a bit line 6 is deposited in a thickness of 100 nm, and further, NiFe 21 and a silicon oxide film 1703 are deposited for the purpose of magnetic shield. These layers are processed in a line-and-space manner in a direction perpendicular to the common ground line 13, which has been formed previously, as shown in FIG. 29. In this process, the bit line 6 and the TMR element 5 are electrically connected to each other. Incidentally, in the present embodiment, in order to reduce the inter-line capacitance of the bit line, a bit line width is reduced. Specifically, a bit line resist pattern is exposed, followed by ashing.

Figure 30:
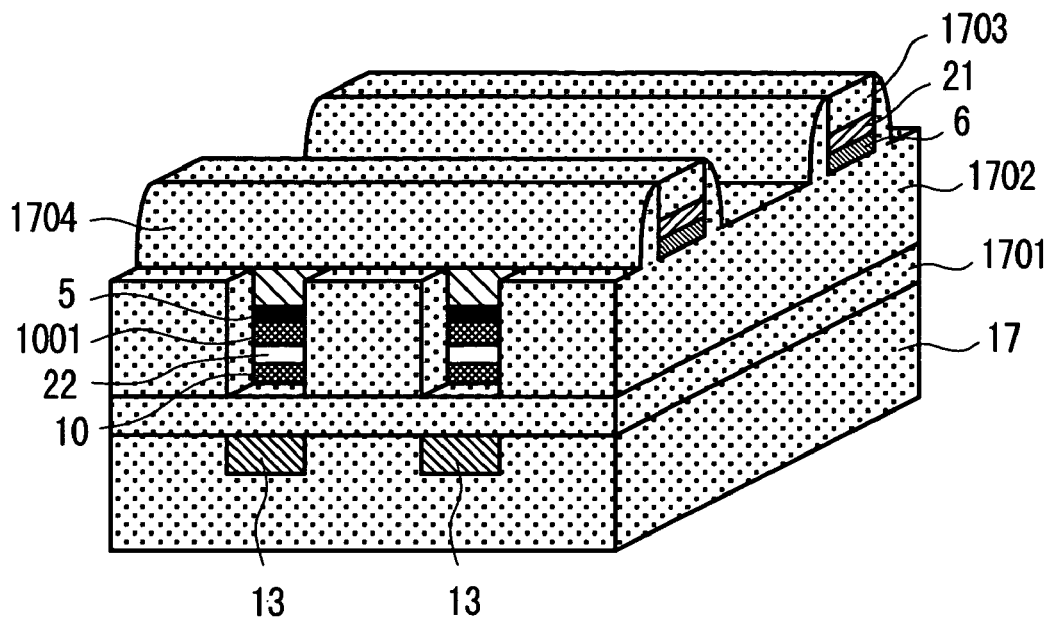
FIG. 30 is a perspective view showing a fabricating process of the semiconductor memory device according to the present invention.

Next, a word line 7 for the select transistor is formed. For the purpose of the prevention of short-circuiting between the word line 7 and the bit line 6, a spacer oxide 1704 is formed on the bit line 6. The underlayer TMR element and the layered polycrystalline silicon film are etched by using the bit line 6 covered with the spacer oxide as a mask, as shown in FIG. 30.

Figure 31:
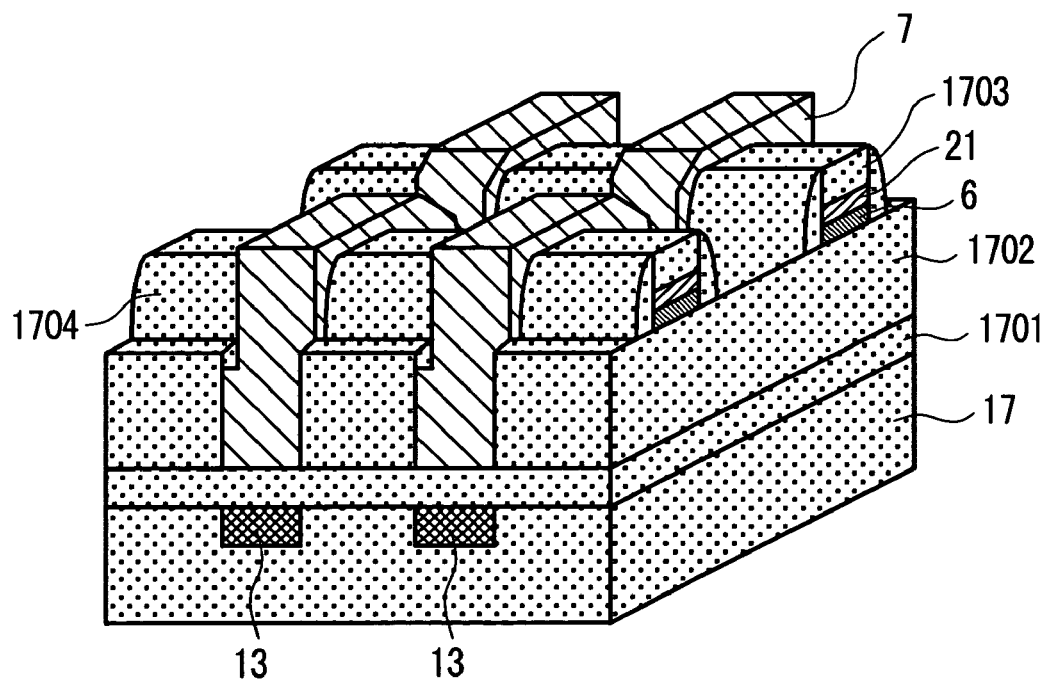
FIG. 31 is a perspective view showing a fabricating process of the semiconductor memory device according to the present invention.

Subsequently, a gate oxide film is formed in a thickness of 10 nm, and further, tungsten serving as the word line 7 is deposited and planarized. Although tungsten is used in the present embodiment, a layered structure consisting of tungsten and polycrystalline silicon holding a barrier metal therebetween, polycide or the like may be used. Next, tungsten is processed in a line-and-space manner in a direction perpendicular to the bit line 6 by normal dry etching, as shown in FIG. 31. In processing the word line 7, an etching step in only the height of the bit line is provided by the effect of planarizing the electrode material. In FIG. 31, there is provided the step having the height of the bit line 6 and the height of the silicon oxide film 1703. Incidentally, in the present embodiment, the word line 7 for the select transistor may be used as a word line for write. In this case, when data is written, a potential difference lower than a threshold voltage of the select transistor is applied to both ends of the word line, thereby preventing any flow of an extra current.

Finally, a required metal wiring layer is formed, thereby providing a desired semiconductor device. In the present embodiment, since the word line for write is arranged near the TMR element, power reduction can be remarkably achieved in comparison with the prior art. Moreover, the use of the vertical transistor can provide a semiconductor memory device having a minimum cell area. Additionally, the common use of the gate electrode and the word line for write in the select transistor can simplify the processes and reduce the cost.

Figure 32:
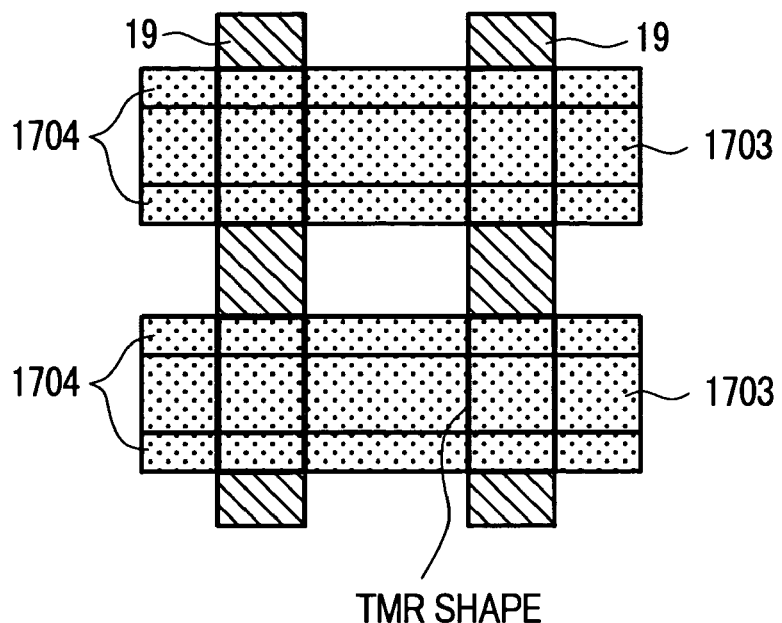
FIG. 32 is a top view showing a fabricating process of the semiconductor memory device according to the present invention.

The present embodiment has features described below. Namely, since the spin direction of the TMR element can be defined by the direction of the current flowing in the bit line, a design burden of a low system can be reduced. In particular, like in the present embodiment, the common use of the gate electrode and the word line for write in the select transistor brings great benefits. This effect will be explained below in reference to the drawing. FIG. 32 illustrates the shape of the TMR element as viewed from above. As is clear from the fabricating processes in the present embodiment, the shape of the TMR element is determined in a self-aligned manner. Therefore, the shape of the TMR element has anisotropy, and further, its longitudinal direction is perpendicular to that of the bit line (traveling in the direction 1703), as shown in FIG. 32. Since the orientation of the magnetic field generated by the flow of the current in the bit line is perpendicular to that of the bit line, the spin direction depends on the direction of the current in the bit line in the case of the TMR element shown in FIG. 32.

Figure 35:
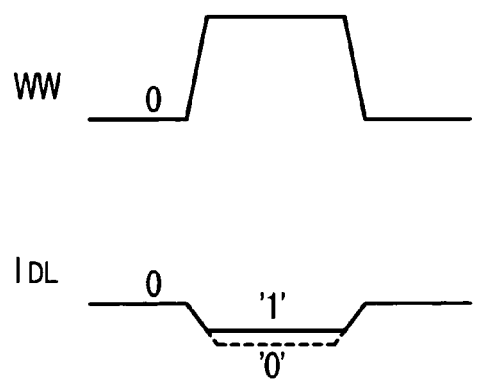
FIG. 35 is a chart illustrating a reading operation in another embodiment according to the present invention.
Figure 36:
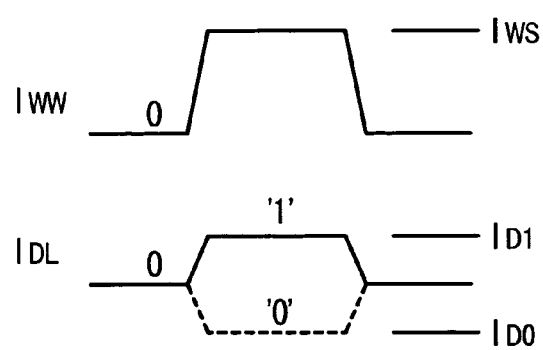
FIG. 36 is a chart illustrating a writing operation in the embodiment according to the present invention.

Finally, simple explanation will be made on a memory array operation in the present embodiment. As illustrated in FIG. 35, the level of a word line WW for read selected in a memory array is made high, so that a reading operation is performed by detecting a current IDL flowing via a desired data line according to a TMR element resistance. At this time, both ends of the word line 7 are kept at an equal potential, so that data is prevented from being erroneously written (disturbed). In the meantime, a current IWW of the selected word line is used as a write word line current IWS, and further, a write current ID1 or ID0 according to the write data is allowed to flow in the selected bit line, thereby generating a magnetic field, so that a writing operation is performed, as illustrated in FIG. 36.

According to the present invention, the MRAM utilizing the tunnel magnetic resistance is configured such that the word line for write surrounds the TMR, so that the effective magnetic field to be applied to the TMR when the data is written can be increased. As a result, it is possible to reduce the current consumption when the data is written, and further, to achieve power reduction in a chip as a whole.

It is to be understood that the present invention is not restricted to the particular embodiments given above, and that various modifications and alterations can be added thereto without departing from the scope of the present invention.

What is claimed is:

1. A magnetic semiconductor memory device comprising:
a semiconductor substrate;
first and second word lines arranged in parallel to each other on the semiconductor substrate;
first and second bit lines crossing the first and second word lines via an insulator layer; and
a first memory cell including a first transistor controlled by the first word line and a first magnetic resistance element disposed between the first transistor and the first bit line;
a second memory cell including a second transistor controlled by the first word line and a second magnetic resistance element disposed between the second transistor and the second bit line;
wherein each of the first and second magnetic resistance elements is formed into a pillar-like shape by patterning a plurality of layered structures formed on the semiconductor substrate, and at least the side surface is covered with the second word line via the insulator layer,
wherein the magnetic semiconductor memory device further comprises a gap between a first part of the second word line along a side surface of the first magnetic resistance element and a second part of the second word line along a side surface of the second magnetic resistance element.

2. A magnetic semiconductor memory device as claimed in claim 1, wherein the direction of an electron traveling in a channel area is perpendicular to the main surface of the semiconductor substrate in the transistor.

3. A magnetic semiconductor memory device as claimed in claim 1, wherein a channel is made of polycrystalline silicon in the transistor.

4. A magnetic semiconductor memory device as claimed in claim 1, wherein at least the upper surface of the bit line is covered with a soft magnetic film.

5. A magnetic semiconductor memory device as claimed in claim 4, wherein the bit line extends between the first and second word lines.

6. A magnetic semiconductor memory device as claimed in claim 1, wherein at least one surface of the second word line is covered with a soft magnetic film.

7. A magnetic semiconductor memory device as claimed in claim 1, wherein the magnetic resistance element is a layered structure including a ferromagnetic material, a tunnel insulator film and a ferromagnetic film.

8. A magnetic semiconductor memory device as claimed in claim 1, wherein the second word line surrounds the bit line in at least three directions via the insulator film.

9. A magnetic semiconductor memory device as claimed in claim 1, wherein the soft magnetic film is permalloy ($Ni_{81}Fe_{19}$).

10. A magnetic semiconductor memory device as claimed in claim 1, wherein the bit line extends between the second word line and the magnetic resistance element.

11. A magnetic semiconductor memory device as claimed in claim 1, wherein the magnetic resistance element is formed into a rectangular shape having short sides and long sides, the direction of the long side being perpendicular to the bit line.

12. A magnetic semiconductor memory device comprising:
   a semiconductor substrate;
   first and second word lines arranged in parallel to each other on the semiconductor substrate;
   first and second bit lines crossing the first and second word lines via an insulator layer;
   a first memory cell including a first transistor controlled by the first word line and a first magnetic resistance element disposed between the first transistor and the first bit line; and
   a second memory cell including a second transistor controlled by the first word line and a second magnetic resistance element disposed between the second transistor and the second bit line;
   wherein each of the first and second magnetic resistance elements is formed into a pillar-like shape by patterning a plurality of layered structures formed on the semiconductor substrate, and the top surface and two side surfaces are covered with the second word line via the insulator layer,
   wherein the magnetic semiconductor memory device further comprises a gap between a first part of the second word line along one of the side surfaces of the first magnetic resistance element and a second part of the second word line along one of the side surfaces of the second magnetic resistance element.

13. A magnetic semiconductor memory device as claimed in claim 2, wherein the direction of an electron traveling in a channel area is perpendicular to the main surface of the semiconductor substrate in the transistor.

14. A magnetic semiconductor memory device as claimed in claim 2, wherein the second word line surrounds the bit line in at least three directions via the insulator film.

15. A magnetic semiconductor memory device as claimed in claim 2, wherein at least one surface of the second word line is covered with a soft magnetic film.

16. A magnetic semiconductor memory device comprising:
   a semiconductor substrate;
   a plurality of word lines formed on the semiconductor substrate;
   a plurality of bit lines crossing the plurality of word lines; and
   a memory array including memory cells arranged at crossing points between the plurality of word lines and the plurality of bit lines and including a first memory cell and a second memory cell;
   wherein each of the memory cells includes a vertical type transistor having a channel area formed in a direction perpendicular to the main surface of the semiconductor substrate and having a magnetic resistance element disposed above the vertical type transistor, corresponding one of the plurality of word lines being a gate electrode of the vertical type transistor and covering at least two side surfaces of the magnetic resistance element via an insulator film,
   wherein gate electrodes of the vertical type transistors included in the first and second memory cells are associated with the same word line,
   wherein there is a gap between a first part of the same word line along one side surface of the magnetic resistance element of the first memory cell and a second part of the same word line along one side surface of the magnetic resistance element of the second memory cell.

17. A magnetic semiconductor memory device as claimed in claim 16, wherein at least the upper surface of the bit line is covered with a soft magnetic film.

18. A magnetic semiconductor memory device as claimed in claim 16, wherein the magnetic resistance element is formed into a rectangular shape having short sides and long sides, the direction of the long side being perpendicular to the bit line.

19. A magnetic semiconductor memory device as claimed in claim 16, wherein a spin flips its direction by varying the direction of a current flowing in the bit line, thus reversing data accordingly.

* * * * *